United States Patent
Gopalraja et al.

(10) Patent No.: US 6,235,169 B1
(45) Date of Patent: *May 22, 2001

(54) MODULATED POWER FOR IONIZED METAL PLASMA DEPOSITION

(75) Inventors: Praburam Gopalraja, Sunnyvale; John C. Forster, San Francisco; Zheng Xu, Foster City; Bradley O. Stimson, Mountain View, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/908,342

(22) Filed: Aug. 7, 1997

(51) Int. Cl.$^7$ .............................. C23C 14/34; C23C 16/00
(52) U.S. Cl. ................................ 204/298.06; 204/298.06; 204/298.34; 156/345; 118/723 I; 118/723 R; 118/723 IR
(58) Field of Search .......................... 118/723 I, 723 AN, 118/723 IR, 723 E, 723 MP, 723 R; 156/345; 204/298.06, 298.08, 298.34; 315/111.51

(56) References Cited

U.S. PATENT DOCUMENTS

| | | |
|---|---|---|
| 3,675,093 | 7/1972 | Russo et al. . |
| 4,284,490 | 8/1981 | Weber . |
| 4,336,118 | 6/1982 | Patten et al. . |
| 4,362,632 | 12/1982 | Jacob . |
| 4,441,092 | 4/1984 | Thornton et al. . |
| 4,626,312 | 12/1986 | Tracy . |
| 4,661,228 | 4/1987 | Mintz . |
| 4,716,491 | 12/1987 | Ohno et al. . |
| 4,792,732 | 12/1988 | O'Loughlin . |
| 4,842,703 | 6/1989 | Class et al. . |

(List continued on next page.)

FOREIGN PATENT DOCUMENTS

| | | |
|---|---|---|
| 0520519 | 12/1992 | (EP) . |
| 0607797 | 7/1994 | (EP) . |
| 0774886 | 5/1997 | (EP) . |
| 0791663 | 8/1997 | (EP) . |
| 0836219 | 4/1998 | (EP) . |
| 2162365 | 1/1986 | (GB) . |
| 2231197 | 11/1990 | (GB) . |
| 59-190363 | 10/1984 | (JP) . |
| 61-190070 | 8/1986 | (JP) . |
| 6232055 | 8/1994 | (JP) . |
| 6283470 | 10/1994 | (JP) . |
| 7176398 | 7/1995 | (JP) . |
| 7176399 | 7/1995 | (JP) . |
| 8153712 | 6/1996 | (JP) . |
| 8288259 | 11/1996 | (JP) . |
| 8606923 | 11/1986 | (WO) . |
| 9207969 | 5/1992 | (WO) . |
| 9214258 | 8/1992 | (WO) . |

OTHER PUBLICATIONS

Written Opinion in PCT application Ser. No. PCT/US98/16395.

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

(List continued on next page.)

*Primary Examiner*—Gregory Mills
*Assistant Examiner*—Parviz Hassan Zadeh
(74) *Attorney, Agent, or Firm*—Konrad Raynes & Victor

(57) ABSTRACT

In a plasma generating apparatus, RF energy applied to a coil positioned to sputter material onto a workpiece, is modulated to control the biasing of the coil. As a consequence, control of coil sputtering may be improved such that the uniformity of deposition may also be improved.

15 Claims, 3 Drawing Sheets

U.S. PATENT DOCUMENTS

| | | |
|---|---|---|
| 4,844,775 | 7/1989 | Keeble . |
| 4,865,712 | 9/1989 | Mintz . |
| 4,871,421 | 10/1989 | Ogle et al. . |
| 4,902,394 | 2/1990 | Kenmotsu et al. . |
| 4,918,031 | 4/1990 | Flamm et al. . |
| 4,925,542 | 5/1990 | Kidd . |
| 4,941,915 | 7/1990 | Matsuoka et al. . |
| 4,948,458 | 8/1990 | Ogle . |
| 4,990,229 | 2/1991 | Campbell et al. . |
| 4,999,096 * | 3/1991 | Nihei et al. ............... 204/298.06 |
| 5,057,185 * | 10/1991 | Thomas, III et al. ......... 204/289.34 |
| 5,065,698 | 11/1991 | Koike . |
| 5,091,049 | 2/1992 | Campbell et al. . |
| 5,122,251 | 6/1992 | Campbell et al. . |
| 5,135,629 | 8/1992 | Sawada et al. . |
| 5,146,137 | 9/1992 | Gesche et al. . |
| 5,175,608 | 12/1992 | Nihei et al. . |
| 5,178,739 | 1/1993 | Barnes et al. . |
| 5,195,045 | 3/1993 | Keane et al. . |
| 5,206,516 | 4/1993 | Keller et al. . |
| 5,225,740 | 7/1993 | Ohkawa . |
| 5,231,334 | 7/1993 | Paranjpe . |
| 5,234,560 | 8/1993 | Kadlec et al. . |
| 5,241,245 | 8/1993 | Barnes et al. . |
| 5,280,154 | 1/1994 | Cuomo et al. . |
| 5,304,279 | 4/1994 | Coultas et al. . |
| 5,312,717 | 5/1994 | Sachdev et al. . |
| 5,346,578 | 9/1994 | Benzing et al. . |
| 5,361,016 | 11/1994 | Ohkawa et al. . |
| 5,366,590 | 11/1994 | Kadomura . |
| 5,368,685 | 11/1994 | Kumihashi et al. . |
| 5,392,018 | 2/1995 | Collins et al. . |
| 5,397,962 | 3/1995 | Moslehi . |
| 5,401,350 | 3/1995 | Patrick et al. . |
| 5,404,079 | 4/1995 | Ohkuni et al. . |
| 5,418,431 | 5/1995 | Williamson et al. . |
| 5,421,891 | 6/1995 | Campbell et al. . |
| 5,424,691 | 6/1995 | Sadinsky . |
| 5,429,070 | 7/1995 | Campbell et al. . |
| 5,429,710 | 7/1995 | Akiba et al. . |
| 5,429,995 | 7/1995 | Nishiyama et al. . |
| 5,430,355 | 7/1995 | Paranjpe . |
| 5,503,676 | 4/1996 | Shufflebotham et al. . |
| 5,571,366 | 11/1996 | Ishii et al. . |
| 5,573,595 | 11/1996 | Dible . |
| 5,585,766 | 12/1996 | Shel . |
| 5,591,493 | 1/1997 | Paranjpe et al. . |
| 5,689,215 | 11/1997 | Richardson et al. . |
| 5,759,280 | 6/1998 | Holland et al. . |
| 5,800,619 | 9/1998 | Holland et al. . |
| 5,902,461 * | 5/1999 | Xu et al. ............... 204/298.06 |

OTHER PUBLICATIONS

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y–W. Kim et al., "Direct Sputter Deposition of AlCu: Film Microstructure and Microchemistry," *J. Vac. Sci. Technol.*, vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and Electron Cyclotron Resonance Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

N. Jiwari et al., "Helicon wave plasma reactor employing single–loop antenna," *J. of Vac. Sci. Technol.*, A 12(4), pp. 1322–1327, Jul./Aug. 1994.

U.S. patent application Ser. No. 08/310,617, filed Sep. 30, 1992.

U.S. patent application Ser. No. 08/567,601, filed Jun. 2, 1995.

* cited by examiner

MODULATED POWER FOR IONIZED METAL PLASMA DEPOSITION

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent the target impact the surface of the target to dislodge, i.e., "sputter" material from the target. The sputtered materials are then transported and deposited on the surface of the semiconductor wafer.

Sputtered material has a tendency to travel in straight line paths, from the target to the substrate being deposited, at angles which are oblique to the surface of the substrate. As a consequence, materials deposited in etched openings including trenches and holes of semiconductor devices having openings with a high depth to width aspect ratio, may not adequately coat the walls of the openings, particularly the bottom walls. If a large amount of material is being deposited, the deposited material can bridge over causing undesirable cavities in the deposition layer. To prevent such cavities, sputtered material can be redirected into substantially vertical paths between the target and the substrate by negatively biasing (or self biasing) the substrate and positioning appropriate vertically oriented electric fields adjacent the substrate if the sputtered material is sufficiently ionized by the plasma. However, material sputtered by a low density plasma often has an ionization degree of less than 10% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density, in the range of $10^{11}$–$10^{13}$ ions/cm$^3$.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

Although ionizing the deposition material facilitates deposition of material into high aspect ratio channels and vias, many sputtered contact metals have a tendency to deposit more thickly in the center of the wafer as compared to the edges. This "center thick" deposition profile is undesirable in many applications where a uniformity of deposition thickness is needed.

As described in copending application Ser. No. 08/680, 335, filed Jul. 10, 1996, (now abandoned), entitled "Coils for Generating a Plasma and for Sputtering" by Jaim Nulman et al., which is assigned to the assignee of the present application and is incorporated herein by reference in its entirety, it has been recognized that the coil itself may provide a source of sputtered material to supplement the deposition material sputtered from the primary target of the chamber. Application of an RF signal to the coil can cause the coil to develop a negative bias which will attract positive ions which can impact the coil causing material to be sputtered from the coil. Because the material sputtered from the coil tends to deposit more thickly at the periphery of the wafer, the center thick tendency for material sputtered from the primary target can be compensated by the edge thick tendency for material sputtered from the coil. As a result, uniformity can be improved. However, a need exists for improved control over the quantity of material sputtered from the coil to increase further the degree of uniformity of deposition that may be achieved.

SUMMARY OF THE PREFERRED EMBODIMENTS

It is an object of the present invention to provide an improved method and apparatus for sputter depositing a layer which enhances uniformity of deposition of sputtered material.

These and other objects and advantages are achieved by a plasma generating apparatus in which, in accordance with one aspect of the invention, the RF energy applied to a coil for the purpose of inductively coupling RF energy into a plasma, is modulated so as to enhance the ability to control the bias level of the coil. It is believed that the power level of the modulation can control the sputtering rate of the coil to provide enhanced control over the uniformity of deposition. As a result, improved uniformity may be achieved. In addition, the power level of modulation may be controlled separately from power level of the RF energy being applied to the coil to ionize the plasma. Consequently, the ionization rate and the coil sputtering rate may be more controlled more independently of each other to provide greater latitude in optimizing these factors.

In the illustrated embodiment, an RF generator is coupled to one end of a coil in a sputtering chamber through an impedance matching network which is tuned to minimize the reflection of RF energy back to the generator. A second generator is coupled to the other end of the coil through a filter. The second generator, referred to herein as a modulation generator, modulates the RF energy supplied by the RF generator at a lower frequency such as a few hundred kilohertz. It is believed that this low frequency modulation of the RF signal applied to the coil directly affects the biasing induced on the coil and therefore directly affects the sputtering rate of the coil. Moreover, the impedance matching network tends to block the lower frequency signal such that much of the power contributed by the modulation generator is expended primarily through the plasma. Hence, it is believed that the sputtering rate may be controlled by the power level of the modulation generator with a degree of independence from the power level provided by the RF generator. Hence these two power levels may be controlled to optimize plasma ionization rate and coil sputtering more independently. As a consequence, the amount of material deposited at the edges may be controlled more independently and the uniformity of the thickness of the deposition may be improved.

DETAILED DESCRIPTION OF THE DRAWINGS

Figure 1:
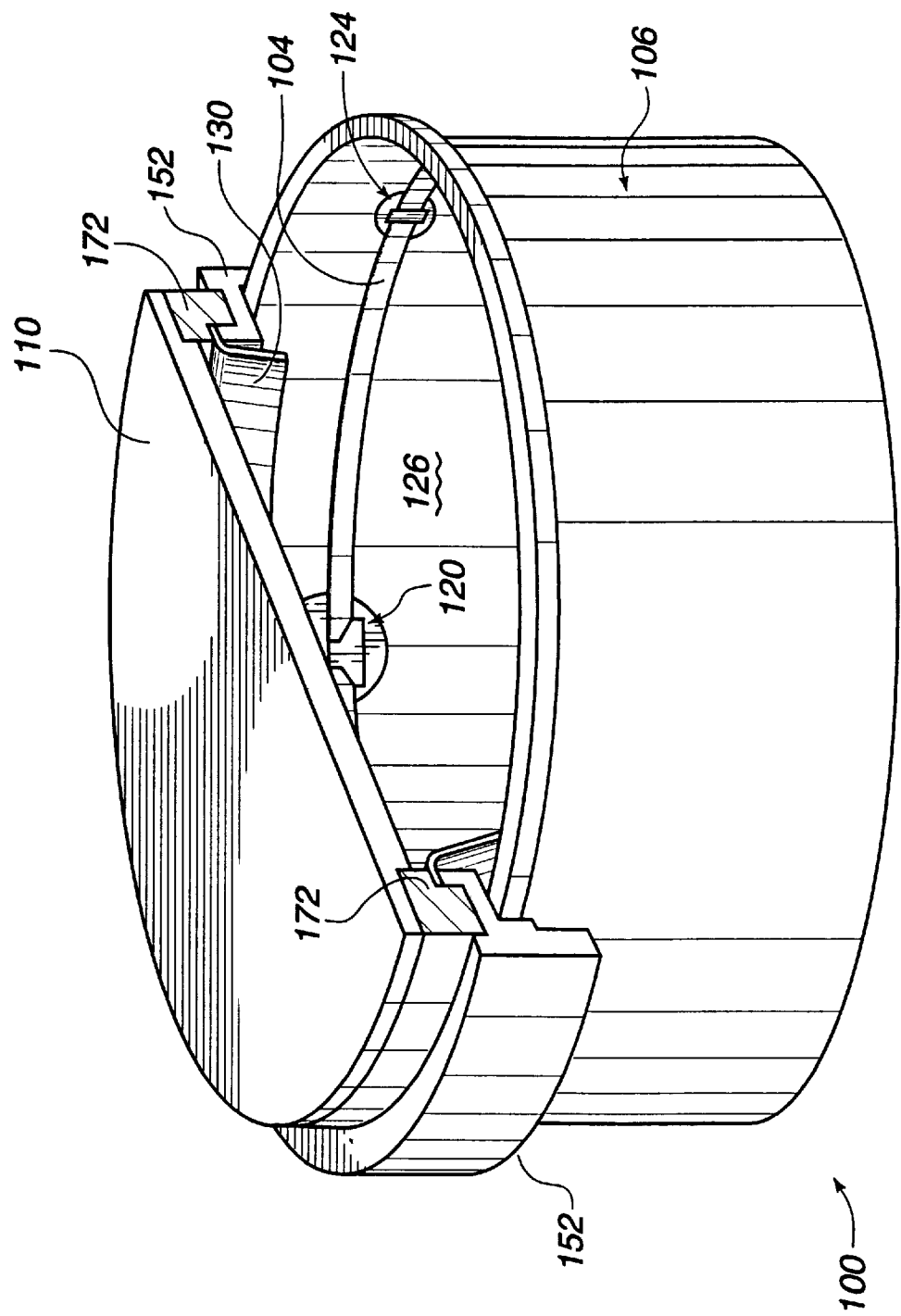
FIG. 1 is a perspective, partial cross-sectional view of a plasma generating chamber used in accordance with an embodiment of the present invention.
Figure 2:
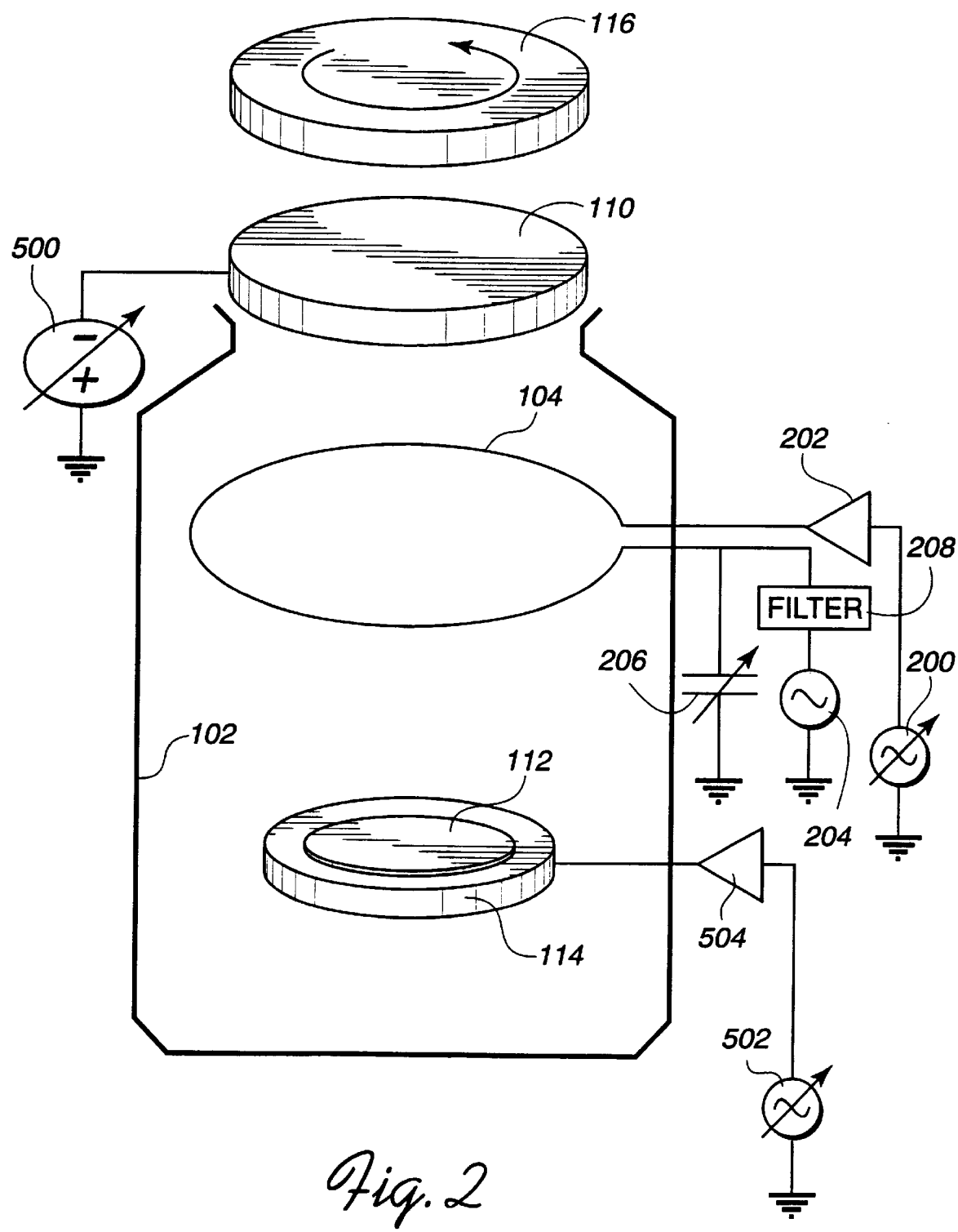
FIG. 2 is a schematic diagram of the electrical interconnections to the plasma generating chamber of FIG. 1.

Referring first to FIGS. 1–2, a plasma generator in accordance with one embodiment of the present invention comprises a substantially cylindrical plasma chamber 100 which is received in a vacuum chamber 102 (represented schematically in FIG. 2). The plasma chamber 100 of this embodiment has a coil 104 carried internally of the vacuum chamber walls by a chamber shield 106. The chamber shield 106 protects the interior walls of the vacuum chamber 102 from the material being deposited within the interior of the plasma chamber 100.

An ion flux strikes a negatively biased target 110 positioned above the plasma chamber 100. The plasma ions eject material from the target 110 onto a substrate 112 which may be a wafer or other workpiece supported by a pedestal 114 at the bottom of the plasma chamber 100. An optional rotating magnet assembly 116 may be provided above the target 110 to produce magnetic fields which sweep over the face of the target 110 to promote uniform erosion by sputtering of the target 110.

Radio frequency (RF) energy from an RF generator 200 (FIG. 2) is radiated from the coil 104 into the interior of the plasma chamber 100, which energizes a plasma within the plasma chamber 100. Deposition material sputtered from the target 110 passes through the plasma energized by the coil 104 prior to being deposited on the substrate 112. A portion of the deposition material passing though the plasma is ionized by the plasma. The ionized deposition material is then attracted to a negative potential on the substrate 112. In this manner, the ionized deposition material is redirected to a more vertical path which facilitates depositing more material into high aspect ratio openings in the substrate.

Figure 3:
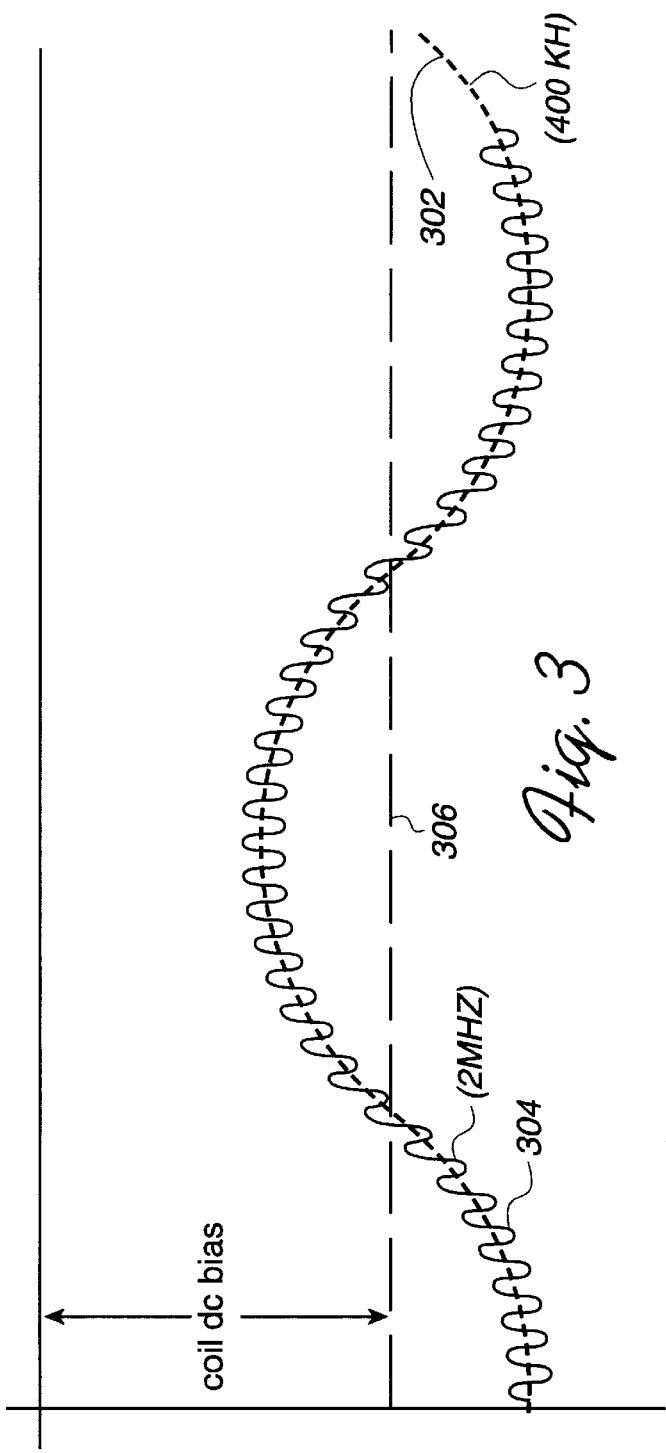
FIG. 3 illustrates an RF signal modulated at a lower frequency.

The RF generator 200 is coupled to one end of the coil 104 through an amplifier and impedance matching network 202 which is tuned to minimize reflection of RF energy back to the coil. The frequency of the RF energy supplied by the generator 200 may be 2 MHz, for example, but of course other frequencies are suitable as well, depending upon the application. A blocking capacitor 206 is coupled to the other end of the coil so that the coil 104 develops a DC bias. As will be explained in greater detail below, in accordance with one aspect of the present invention, a second generator, referred to herein as the modulation generator 204, is also coupled to the other end of the coil 104 through a filter 208. The modulation generator 204 modulates the 2 MHz RF signal as shown in FIG. 3. In the illustrated embodiment, the modulation frequency is 400 kHz, but again, may be other frequencies, depending upon the application. The 400 kHz modulation frequency is approximately three orders of magnitude (approximately 1000 times) lower than that of the 2 MHz RF signal of the generator 200. Hence, the respective periods of the two signals are not drawn to scale in FIG. 3 for purposes of clarity. The filter 208 has a bandwidth which substantially blocks the frequency of the RF signal of the generator 200. Hence, in the illustrated embodiment, the filter 208 blocks frequencies at 2 MHz.

The output of the modulation generator 204 is added to the 2 MHz signal indicated at 304 in FIG. 3. As a consequence, the peak to peak voltage of the RF signal varies periodically over time at a frequency of 400 kHz. It is believed that modulating the RF energy applied to the coil in this manner provides enhanced control on the bias level induced on the coil 104. This coil bias level as represented by the line 306 in FIG. 3 results from negatively charged electrons and positively charged ions from the plasma being alternately attracted to the coil 104 as the RF signal applied to the coil alternates between positive and negative potentials. Because the positive ions (typically Argon ions) are much more massive than the electrons, the electrons generally have a higher mobility than the positive ions. As a result, a negative bias can be induced on the coil by applying an RF signal to the coil.

The positive ions are attracted to the negative bias on the coil causing some of those positive ions to impact the surface of the coil, thereby sputtering material from the coil. The more negative the bias level of the coil, the greater velocity the positive ions tend to achieve prior to impacting the coil surface. As a result, the quantity of material sputtered from each ion impact is often a function of the coil bias level. In addition, the transfer of positive ions from the plasma to the coil is a current which has an associated consumption of power. A source for this power consumption is the energy applied to the coil.

It is believed that by modulating the peak to peak voltage of the RF signal applied to the coil, the negative bias level of the coil may be controlled so as to control the velocity of the ions impacting the coil surface. In this manner, the quantity of material sputtered by the impact of ions may be affected by modulating the RF energy applied to the coil. It is further believed that the power consumed in modulating the RF energy applied to the coil is related to the coil sputtering current, i.e. the rate at which positive ions impact the coil surface. Because the modulation frequency is substantially lower than the radio frequency of the generator 200, the impedance of the matching network 202 (optimized to match the impedance of the coil and network 202 to that of the RF generator 200) tends to block the modulation signal from passing through the network 202. As a result, it is believed that much of the power contributed by the modulation generator 204 is expended primarily through the plasma in the form of coil sputtering current. Thus, it is believed that the overall sputtering rate of the coil may be controlled as a function of the modulation frequency and the power level of the modulation generator 204.

Figure 4:
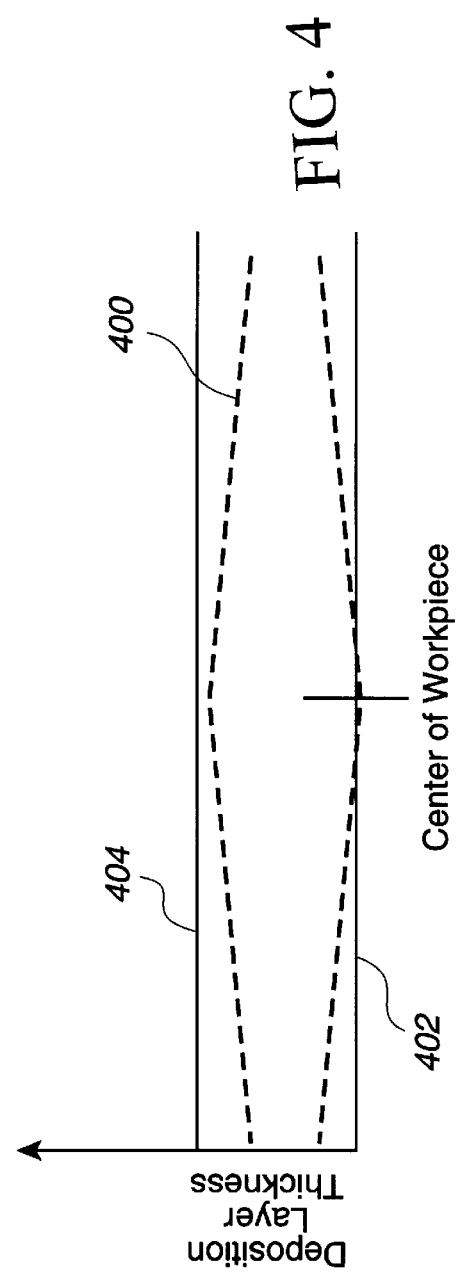
FIG. 4 illustrates the center thick deposition profile of a planar target and an edge thick deposition profile of a peripheral coil target.

FIG. 4 indicates at 400 the deposition profile onto a wafer or other workpiece for material sputtered from a typical planar target such as the target 110. As shown therein (exaggerated for purposes of clarity), the deposition profile tends to be somewhat "center thick" such that the deposition rate at the center of the wafer is greater than that at the periphery. It is believed that one factor causing this center thick profile is the relatively high pressure at which inductively coupled plasmas are operated to ionize the deposition material. Because of the high pressures, the sputtered material tends to be scattered more frequently such that even with ionization, more material tends to deposit toward the center at the expense of material directed toward the periphery.

In the illustrated embodiment, the coil 104 is supported by the shield 106 (FIG. 1) so that the coil 104 encircles the substrate 112 (FIG. 2) in a position which is above and recessed outwardly from the periphery of the substrate 112 as schematically represented in FIG. 2. As a result, the coil 104 is closer to the periphery than the center of the substrate. Consequently material sputtered from the coil 104 has a greater likelihood of depositing near the periphery of the substrate as opposed to the center of the substrate, as represented by the deposition profile 402. This edge thick profile 402 of the coil sputtered material can offset or compensate for a center thick tendency 400 of the target 110 sputtered material. Thus, the actual overall deposition profile 404 which is a combination of the deposition profiles 400 and 402 can be more uniform than the deposition profile 400 alone. As set forth above, the quantity of material which is sputtered from the coil 104 may be adjusted by adjusting the modulation power applied to the coil. In this manner, the uniformity of deposition may be improved.

FIG. 2 includes a schematic representation of the electrical connections of the plasma generating apparatus of this illustrated embodiment. To sputter target material onto the substrate 112, the target 110 is preferably negatively biased by a variable DC power source 500 to attract the ions of the ion flux. The power source 500, and the other power sources discussed below, are preferably controlled by a microprocessor based workstation which is programmed to implement the processes described herein.

The pedestal 114 may be negatively biased by a variable RF power source 502 coupled by a match network 504 to the pedestal 114 to bias the substrate 112 negatively to attract the ionized deposition material to the substrate 112. In an alternative embodiment, the pedestal 114 may be biased by a high frequency AC power source. In yet another alternative embodiment, as set forth in copending application Ser. No. 08/677,588, entitled "A Method for Providing Full-face High Density Plasma Physical Vapor Deposition," filed Jul. 9, 1996 (now abandoned) and assigned to the assignee of the present application, an external biasing of the substrate 112 may be omitted.

As set forth above, one end of the coil 104 is coupled to an RF source such as the output of the amplifier and matching network 202, the input of which is coupled to the RF generator 200. The other end of the coil is coupled to a blocking capacitor 206 which induces a DC bias onto the coil 104. The modulation generator 204 is a high frequency signal generator which is coupled to the other end of the coil 104 through the filter 208. It is recognized that the modulation generator 204 may be coupled to the coil 104 at points other than the end such as the middle of the coil, for example.

The coil 104 is carried on the chamber shield 106 by a plurality of coil standoffs 120 (FIG. 1) which electrically insulate the coil 104 from the supporting chamber shield 106. In addition, the insulating coil standoffs 120 have an internal labyrinth structure which permits repeated deposition of conductive materials from the target 110 onto the coil standoffs 120 while preventing the formation of a complete conducting path of deposited material from the coil 104 to the chamber shield 106. Such a completed conducting path is undesirable because it could short the coil 104 to the chamber shield 106 (which is typically grounded).

RF power is applied to the coil 104 by feedthrough bolts which are supported by insulating feedthrough standoffs 124 (FIG. 1). The modulation generator is likewise coupled to its coil by a feedthrough standoff 124. The feedthrough standoffs 124, like the coil support standoffs 120, permit repeated deposition of conductive material from the target onto the feedthrough standoff 124 without the formation of a conducting path which could short the coil 104 to the chamber shield 106. The coil feedthrough standoff 124, like the coil support standoff 120, has an internal labyrinth structure to prevent the formation of a short between the coil 104 and the wall 126 of the shield.

The target 110 generally has the shape of a cylindrical disk as seen in FIGS. 1 and 2. However, other design shapes for the target 110 are, of course, possible, and may lead to different deposition profiles for the material deposited from the target onto the substrate. For example, a secondary annular target (of titanium, aluminum or other suitable materials) may be positioned around the periphery of the substrate, to supplement the material being sputtered from a primary planar target onto the substrate, with the primary planar target positioned above the substrate. Each target which is negatively biased should be electrically insulated from the vacuum chamber which is typically grounded.

In the illustrated embodiment, the target 110 is carried by a source adapter 152 and an insulator ring 172 which insulates the target 110 from the adapter 152. A dark space shield 130 is also supported by the adapter 152.

The coil 104 of the embodiment illustrated in FIGS. 1–2 is made of approximately 50 mm (2 inch) by approximately 1.6 mm (1/16 inch) heavy-duty bead-blasted solid high-purity (preferably 99.995% pure) titanium or copper ribbon formed into a single turn helical coil having a diameter of about 290 mm (11.5 inches). However, other highly conductive materials and shapes may be utilized depending upon the material being sputtered and other factors. For example, the ribbon may be as thick as 3 mm (1/8 inch). Also, if the material to be sputtered is aluminum, both the target and the coil should be made of high-purity aluminum. In addition to the ribbon shape illustrated, flat rings are suitable. Also, hollow tubing may be utilized, particularly if water cooling is desired.

Several of the embodiments discussed above utilized a single coil 104 with a single turn in the plasma chamber 100. It should be recognized that the present invention is applicable to plasma chambers having a multiple turn RF coil. The advantage of a multiple turn coil is that the required current levels can be substantially reduced for a given RF power level. However, multiple turn coils tend to be more complicated and hence most costly and difficult to clean as compared to single turn coils. For example, a three turn helical coil of titanium and its associated supporting structure could be quite expensive. A multi-turn coil may also have shapes other than helical such as spiral, for example.

It should also be recognized that the present invention is applicable to plasma chambers having more than one RF powered coil. For example, the present invention may be applied to multiple coil chambers for launching helicon waves of the type described in copending application Ser. No. 08/559,345, filed Nov. 15, 1995 for "Method and Apparatus for Launching a Helicon Wave in a Plasma" which is assigned to the assignee of the present application and is incorporated herein by reference.

The appropriate RF and high frequency generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary from, for example, 1 MHz to 4 MHz.

The modulation generator 204 may be a AE PDX 500, for example. A modulation frequency of 400 kHz is preferred but may be other frequencies including those that range from 100 kHz to 700 kHz, for example. Although the envelope 302 is shown in FIG. 3 of the illustrated embodiment as sinusoidal, it is anticipated that the RF signal may be modulated by a variety of functions including functions such as sawtooth, square-wave and irregular functions. Moreover, the modulation frequency need not be constant but it is anticipated it may vary during the deposition, depending upon the needs of the application. For example, varying the modulation frequency may permit a corresponding variation in coil biasing and hence in sputtering rate from the coil in those applications in which varying the coil sputtering rate during deposition may be useful.

In the illustrated embodiments above, the chamber shield 106 has a diameter of 400 mm (16"), but it is anticipated that satisfactory results can be obtained with a diameter in the range of 150–635 mm (6"–25"). The chamber shield 106 may be fabricated from a variety of materials including insulative materials such as ceramics or quartz. However, the chamber shield 106 and all metal surfaces likely to be coated with the target material are preferably made of a material such as stainless steel or copper, unless made of the same material as the sputtered target material. The material of the structure which will be coated should have a coefficient of thermal expansion which closely matches that of the material being sputtered to reduce flaking of sputtered material from the chamber shield 106 or other structure onto the substrate 112. In addition, the material to be coated should have good adhesion to the sputtered material. Thus for example if the deposited material is titanium, the preferred metal of the chamber shield 106, standoffs 120 and 124 and other structures likely to be coated is bead-blasted titanium. Any surfaces which are more likely to sputter, such as the end caps of the coil and feedthrough standoffs 120 and 124, would preferably be made of the same type of material as the target 110, such as high-purity, bead-blasted titanium, for example. Of course, if the material to be deposited is a material other than titanium, the preferred metal is the deposited material, stainless steel, for example. Adherence can also be improved by coating the structures with molybdenum prior to sputtering the target 110. However, it is preferred that the coil 104 (or any other surface likely to sputter) not be coated with molybdenum or other materials since the molybdenum can contaminate the substrate 112 if sputtered from the coil 104.

The substrate 112 to target 110 spacing is in a range of about 120–150 mm, preferably about 140 mm (about 5.5"), but can also range from about 38 to 200 mm (1.5" to 8"). For this wafer to target spacing, suitable stepped wafer bottom coverage may be achieved with a coil diameter of 290 mm (11.5 inches) spaced from the target by a distance of approximately 42.8 mm (1.7 inches). It has been found that increasing the diameter of the coil which moves the coil away from the workpiece edge may have an adverse effect on bottom coverage. On the other hand, decreasing the coil diameter to move the coil closer to the wafer edge can adversely affect layer uniformity.

Deposition uniformity also appears to be a function of coil spacing from the target. As previously mentioned, a spacing of 42.8 mm (1.7 inches) between the coil and target may be found satisfactory for a target to wafer spacing of 140 mm. Moving the coil vertically either toward or away from the target (or wafer) can adversely affect deposition layer uniformity.

A variety of precursor gases may be utilized to generate the plasma including Ar, and reactive gases such as $H_2$, $O_2$, $NF_3$, $CF_4$ and many others may be used as well. Various precursor gas pressures are suitable including pressures of 0.1–50 mTorr. However, pressures between 10 mTorr and 50 mTorr facilitate ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A semiconductor fabrication system for sputtering material onto a workpiece, the system comprising:
    a chamber having a plasma generation area within said chamber;
    a target carried by said chamber and comprising a target material to be sputtered from said target;
    a platform for holding a workpiece;
    a coil carried by said chamber, adapted to receive a first RF signal and positioned to couple RF energy into said plasma generation area to generate a plasma in said plasma generation area to ionize said sputtered target material; and
    a modulation generator for providing a signal to said coil to modulate said RF signal to said coil at a second, lower frequency.

2. The system of claim 1 further comprising an RF generator coupled to said coil for providing said first RF signal to said coil wherein said modulation generator modulates the peak to peak voltage of said RF signal on said coil.

3. The system of claim 2 further comprising a matching network which includes a variable impedance, coupling said RF generator to said coil.

4. The system of claim 3 wherein said matching network has an impedance which substantially blocks said modulation generator signal at said second, lower frequency.

5. The system of claim 1 further comprising a blocking capacitor coupled to said coil and a blocking filter coupled between said coil and said modulation generator.

6. The system of claim 1 wherein said coil has first and second ends and said system further comprises an RF generator coupled to said first end of said coil for providing said first RF signal to said coil, and a blocking filter coupling said second end of said coil to said modulation generator.

7. A semiconductor fabrication system for sputtering material onto a workpiece, the system comprising:
    a chamber having a plasma generation area within said chamber;
    a target carried by said chamber, said target having a center and comprising a target material to be sputtered from said target onto a workpiece;
    a platform for holding a workpiece;
    a coil positioned to couple energy into said plasma generation area; and
    means coupled to said coil for providing energy at a first RF frequency to generate a plasma in said plasma generation area to ionize said sputtered target material, and for modulating said energy at a second frequency to bias said coil to induce sputtering of said coil.

8. A process for sputter depositing a layer of material onto a workpiece, comprising:
    sputtering a target of a material to form a stream of sputtered target material directed toward a workpiece;
    supplying an RF energy signal to a coil at a first frequency to maintain a plasma to ionize a portion of said stream of sputtered target material; and
    modulating said RF energy signal at a second frequency to bias said coil to induce sputtering of material from said coil to form a second stream of sputtered material for deposition on said workpiece.

9. The process of claim 8 wherein said second frequency is below radio frequency.

10. The process of claim 8 wherein said second frequency is within the range of 100–700 kHz.

11. The process of claim 10 wherein said second frequency is approximately 400 kHz.

12. The process of claim 10 wherein said first frequency is approximately 2 MHz.

13. The process of claim 8 wherein said RF signal is supplied by an RF generator coupled to said coil through a matching network.

14. The process of claim 8 wherein said modulating is performed by a modulation generator coupled to said coil and comprises modulating the peak to peak voltage of said RF signal on said coil.

15. A process for sputter depositing a layer of material onto a workpiece, comprising:

sputtering a planar target of a material to form a stream of sputtered target material directed toward a workpiece;

applying an RF energy signal at a first RF frequency from an RF generator to a coil to maintain a plasma to ionize a portion of said stream of sputtered target material; and applying a modulating signal to said coil at a second, sub-RF frequency from a modulation generator coupled to said coil to modulate said RF energy signal applied to said coil to bias said coil to induce sputtering of material from said coil to form a second stream of sputtered coil material for deposition on said workpiece.

* * * * *